U. H. F. BAND PASS FILTER STRUCTURES

Filed July 2, 1951

INVENTORS
WEN YUAN PAN &
DAVID J. CARLSON
BY H. L. Newton
ATTORNEY

United States Patent Office 2,714,192

Patented July 26, 1955

2,714,192

U. H. F. BAND PASS FILTER STRUCTURES

Wen Yuan Pan, Collingswood, and David J. Carlson, Haddon Heights, N. J., assignors to Radio Corporation of America, a corporation of Delaware Application July 2, 1951, Serial No. 234,752

11 Claims. (Cl. 333—73)

This invention relates generally to filter structures for high frequency signals, and particularly relates to a resonant structure which provides a band-pass filter for desired ultra high frequency (U. H. F.) signals with high attenuation for undesired U. H. F. signals in at least one adjacent frequency region.

Recently the U. H. F. band from 500 to 890 megacycles (mc.) has been tentatively allocated for broadcasting television images. Tunable circuit structures in accordance with the invention are particularly adapted for tuning receivers to selected television stations broadcasting within the new U. H. F. band. It will be appreciated that a tunable circuit for use within the new U. H. F. television band cannot consist of lumped circuit elements because the frequency of the carrier waves is too high. On the other hand, the frequency of a carrier wave within this new U. H. F. range is so low that resonant structures such as a resonant cavity or a wave guide, which are conventionally utilized in the upper U. H. F. band, cannot conveniently be used. It is well know that resonant structures such as cavities and wave guides are particularly useful at frequencies of 300 mc. and higher.

For any broadcast receiver adapted to receive signals within the new U. H. F. television band, a tunable band-pass filter is required which may be provided between the antenna and the first radio-frequency amplifier, or if no radio-frequency amplifier is provided, between the antenna and the mixer stage. Such a band-pass filter structure should have a high Q even at high frequencies, where Q indicates a figure of merit which is sometimes called the magnification factor and which may be defined as the ratio of the energy stored by the resonant circuit or structure over the energy dissipated.

A superheterodyne receiver for receiving television signals of the type referred to should also be designed to reject image frequency signals. If, for example, the frequency of the local oscillator is below the frequency of the signals to be received, it will be obvious that an undesired signal having a frequency below that of the oscillator by an amount equal to the intermediate frequency will also beat with the oscillatory wave to develop an undesired intermediate-frequency signal. Such an undesired signal is usually called the image frequency signal. In a similar manner, if the oscillator frequency should be above the signal frequency, the image frequency, in turn, will be above the oscillator frequency. Accordingly, in any well designed superheterodyne receiver, rejection of the image frequency should be provided to prevent disturbance.

It has recently been found that the radiation from the local oscillator of a superheterodyne FM or television receiver may produce severe and undesired disturbances in other fields of communications. Accordingly, radiation from the local oscillator should be minimized. In general, this radiation may be from the chassis and associated conductors or else through the antenna. Radiation from the chassis can be minimized by proper shielding. However, radiation from the antenna can be minimized only by providing a highly selective circuit between the mixer and the antenna for substantially eliminating such undesired oscillator radiation.

It is, accordingly, an object of the present invention to provide a U. H. F. filter structure having a pass band of predetermined width to transmit a desired signal and having an adjacent frequency region of high attenuation for substantially rejecting another undesired U. H. F. signal such, for example, as an image frequency signal or the wave developed by the local oscillator of a superheterodyne receiver.

A further object of the invention is to provide, in a superheterodyne receiver, a filter structure tunable over a predetermined portion of the U. H. F. range and having a signal pass band for radio-frequency signals to be received and including means for substantially rejecting image frequency signals or for minimizing oscillator radiation or both.

Another object of the invention is to provide a U. H. F. filter structure of the type referred to which has a high Q and substantially uniform coupling over its entire tuning range, and where the image frequency or oscillator frequency attenuation region tracks with the center frequency of the pass band throughout the tuning range.

The U. H. F. filter structure of the present invention may be considered an improvement over the "Double Tuned Filter Structure," disclosed and claimed in the copending application to W. Y. Pan, which has been filed on June 5, 1951, Serial No. 230,043, now Patent No. 2,702,373, issued February 15, 1955, and assigned to the assignee of this application. The filter structure disclosed in the Pan application referred to provides a band pass filter which is tunable over a portion of the U. H. F. range. The filter structure itself consists of two resonant circuit structures which may be identical to each other. Each of the circuit structures includes two conductive capacitance members which may, for example, consist of metallic coatings provided on the outside of a tube of dielectric material. Two conductors which represent inductance are connected individually to the capacitance members or coatings. The free ends of the four conductors may be connected together and grounded. A tuning element such as a metallic core may be provided within the tube so that when the core is moved, at least one of the capacitances between one of the coatings and the core may be varied.

In accordance with the present invention, one of the circuit structures is provided with three capacitance members which again may consist of metallic coatings provided on the outside of a dielectric tube such as a glass cylinder. The conductors are connected to two of the three coatings. An input signal may now be impressed between the third coating and the common connection of the four conductors, while the output signal may be obtained between the common connection of the conductors and one of the conductors of the second circuit structure.

A filter structure of this type consists of two circuit structures one of which is equivalent to a series resonant circuit while the second is equivalent to a series resonant circuit which is shunted by another series resonant circuit. This shunt circuit is represented by the capacitance formed between the tuning core and one of the coatings and the associated conductor. This circuit may be made to resonate, for example, at the image frequency or at the oscillator frequency to attenuate a signal at such a predetermined frequency.

It is also feasible to provide two identical circuit structures each consisting of three coatings. Accordingly, each circuit structure is equivalent to two series resonant circuits so that high attenuation may be provided at two predetermined frequencies which preferably are outside of the pass band of the filter.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which:

Figure 1 is a view in perspective of a filter structure embodying the present invention and providing a pass band for a desired U. H. F. signal and an adjacent frequency region having a high attenuation for rejecting, for example, signals or waves at the oscillator or image frequency;

Figures 1, 2, 3, 4, 5, 6:
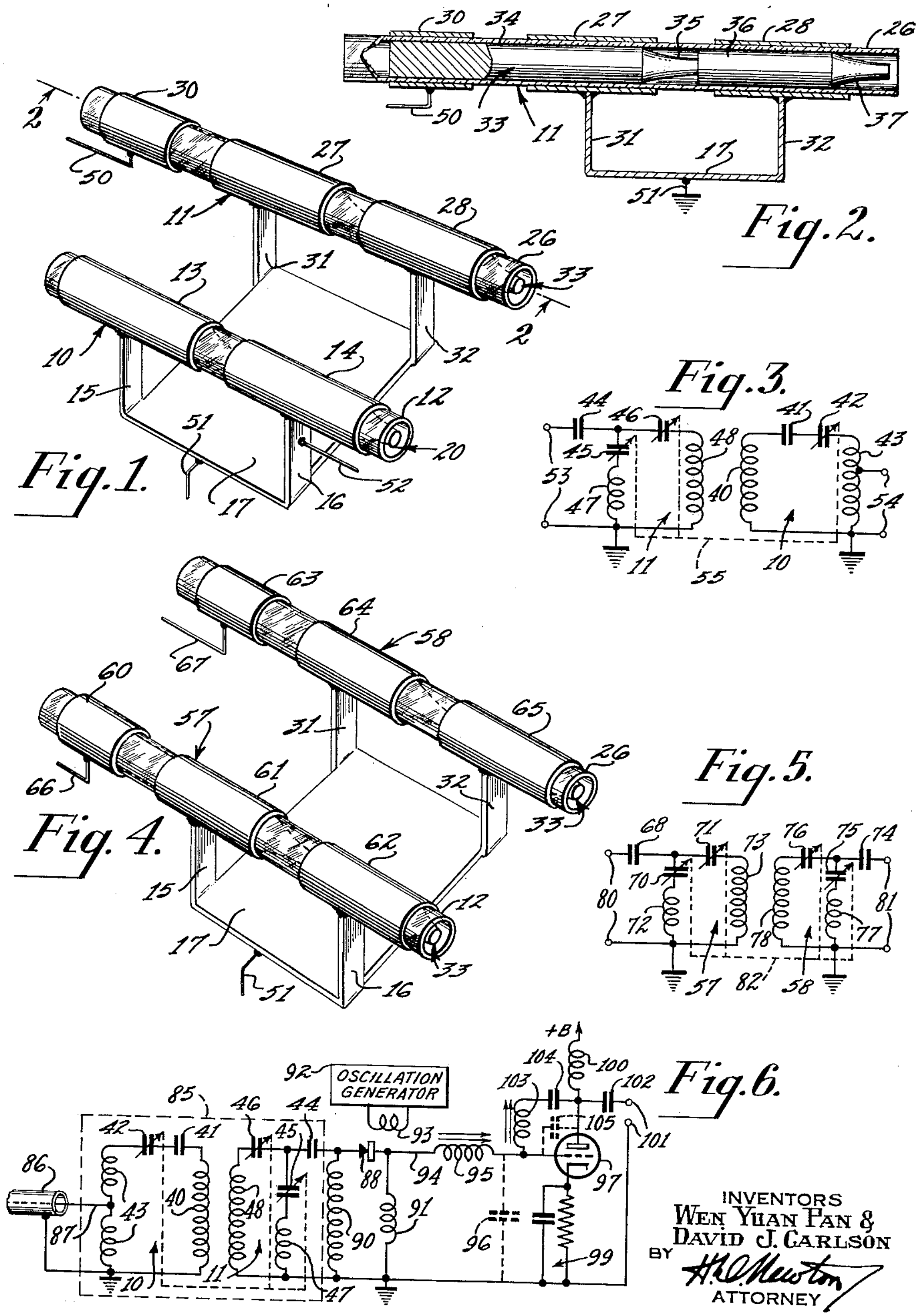
Figure 2 is a view, partly in section, taken on line 2—2 of the filter structure of Figure 1.
Figure 3 is an equivalent circuit diagram of the filter structure of Figure 1 illustrating its use for minimizing radiation of the locally developed oscillatory wave.
Figure 4 is a view in perspective of another embodiment of the filter structure of the invention which provides a signal pass band and two adjacent frequency regions having high attenuation for rejecting, for example, energy at both the image and the oscillator frequencies.
Figure 5 is an equivalent circuit diagram of the filter of Figure 4.
Figure 6 is a schematic circuit diagram of a portion of a superheterodyne receiver utilizing the filter structure of Figure 1 for providing image frequency rejection.

Referring now to the drawing in which like components have been designated by the same reference characters throughout the figures and particularly to Figures 1 and 2, there is illustrated a filter structure which comprises two resonant circuit structures 10 and 11. The circuit structure 10 includes a hollow cylinder or tube 12 consisting of a material having a high dielectric constant such, for example, as a ceramic material or glass. Preferably tube 12 consists of glass which may readily be manufactured with a high dielectric constant and with a wall thickness and tubing diameter which can be maintained within close tolerances in mass production.

A pair of conductive capacitive members 13 and 14 is provided on the outside of glass tubing 12. The capacitive members 13, 14 consist of a conductor such, for example, as copper or silver and may be coated to provide sleeves disposed about the circumference of the glass tube 12. A pair of conductors 15 and 16 is electrically connected to each of the coatings 13, 14. The conductors may, for example, consist of a suitable metal such as copper or brass, or they may be silver plated steel.

Preferably, the free ends of conductors 15, 16 are connected together. This may be effected by providing a metallic plate 17 with which the conductors 15, 16 may be integral. Thus, the metallic plate 17 may be formed integral with conductors 15, 16 which may be turned upward to provide leg portions 15, 16 extending at right angles with respect to the plate 17.

A movable conductive tuning element 20 cooperates with the capacitance members or coatings 13, 14. The tuning element may take the form of a metallic core 20 which has one extreme position where it extends within both coatings 13, 14. The tuning core 20 may be provided with a tapered end portion to provide a predetermined relationship between the movement of the tuning core 20 and the resulting variation of the resonant frequency of the resonant filter structure. The tuning core 20 may be moved in any suitable manner into its first extreme position wherein its tapered end portion is substantially between coatings 13 and 14 and into a second extreme position where its tapered end portion is disposed within coating 14.

It will, accordingly, be seen that the capacitance between coating 14 and core 20 varies upon movement of the tuning core. On the other hand, the capacitance provided between coating 13 and core 20 remains substantially constant upon movement of the tuning core.

The second resonant circuit structure 11 includes a tube 26 consisting again of a material having a high dielectric constant and provided with three metallic coatings 27, 28 and 30. A pair of conductors 31, 32 is connected individually to the two coatings 27, 28. The conductors 30, 31 may consist of another pair of leg portions which are formed integral with the plate 17 and form a right angle therewith. A tuning core 33 may be provided within tube 26.

As clearly shown in Figure 2, the tuning core 33 consists of a cylindrical portion 34 which extends within coating 30 and within the major portion of coating 27. The tuning core 33 includes an intermediate tapered portion 35 and a second cylindrical portion 36 having a tapered end portion 37. Accordingly, it will readily be seen that movement of the tuning core 33 will vary the capacitances between the tuning core and the coatings 27 and 28. On the other hand, the capacitance between the tuning core 33 and the coating 30 remains constant because the cylindrical core portion 34 moves within the coating 30. It will be appreciated that the tuning core 20 of the resonant circuit 10 consists essentially of the portions 34 and 35 of the tuning core 33.

The operation of the filter structure of Figures 1 and 2 may best be explained by reference to the equivalent circuit of Figure 3. The two equivalent circuits are again indicated by the numerals 10 and 11. The resonant circuit 10 includes a fixed inductor 40, a fixed capacitor 41, a variable capacitor 42 and a fixed inductor 43. The inductor 40 represents the inductance of conductor or leg 15. The fixed capacitor 41 indicates the capacitance between core 20 and coating 13, while the variable capacitor 42 indicates the capacitance between the tuning core 20 and coating 14. Finally, inductor 43 represents the inductance of the conductor or leg 16.

The second resonant circuit 11 comprises a fixed capacitor 44, two variable capacitors 45 and 46 and two fixed inductors 47 and 48. The fixed capacitor 44 represents the capacitance between coating 30 and core 33, while the variable capacitors 45 and 46 represent the capacitance between the tuning core 33 and coatings 27 and 28 respectively. The inductors 47 and 48 indicate the inductance of legs 31 and 32.

Accordingly, the resonant circuit 10 is series resonant. The resonant circuit 11 includes two series resonant circuits 46, 48 and 45, 47 which are connected in parallel. Such a filter network consisting of circuits 10, 11 may be used to provide a pass band and one adjacent frequency region having a high attenuation. By proper choice of the circuit constants of the filter network the shunt resonant circuit 45, 47 may be made to resonate within a frequency outside of that of the pass band. Thus, the filter network may be utilized for providing rejection of an undesired image frequency signal or to reduce oscillator radiation from the local oscillator of a superheterodyne receiver and, furthermore, to pass the signal transmitted by a desired station.

For example, an input signal may be impressed on lead 50 which is connected to metallic coating 30. The common connection of the legs 15, 16, 31, 32 may be grounded and this may, for example, be effected by grounding plate 17 through a lead 51. The output signal may be derived, for example, from coating 14 and the output lead 52 may be connected to an intermediate point of leg 16 in order to match impedances between the filter network and the subsequent utilization circuit.

Consequently, in Figure 3 the input terminals 53 are connected between ground and the coupling capacitor 44, while the output terminals 54 are connected between ground and an intermediate point of inductor 43. A filter circuit of this type may be provided between the antenna of a U. H. F. superheterodyne receiver or converter and the mixer stage. When the shunt resonant circuit 45, 47 is tuned to the frequency of the local oscillator, oscillator radiation through the antenna is minimized. The series resonant circuit 45, 47 simply shunts the oscillator frequency voltage or current in the resonant circuit 11. If the oscillatory energy were shunted in the resonant circuit 10, the shunt resonant circuit would, in turn, radiate the oscillatory energy which might be picked up by the resonant circuit 11, and in that case, oscillator radiation could not be eliminated.

As will be more fully disclosed hereinafter in connection with Figure 6, it is also possible to impress an input signal on leads 51, 52 and to derive the output signal from leads 50, 51. In that case, the resonant circuit 10 is the input circuit and the resonant circuit 11 the output circuit. With such an arrangement, image frequency rejection may be obtained.

It is to be understood that the tuning cores 20 and 33 need not necessarily be movable but may be fixed. In that case, the filter network provides a pass band and an adjacent frequency region of high attenuation which have a fixed frequency. Preferably, however, the tuning cores 20 and 33 are movable and may be moved in unison so that the variable capacitors 42, 45 and 46 are ganged together as indicated by the dotted line 55.

The fixed capacitor 44 of the resonant circuit 11 functions as a coupling capacitor. Furthermore, the impedance of the series resonant circuit 45, 47 at the frequency of the signal to be received, that is, at the frequency of the pass band serves the further purpose of matching the impedance of the input circuit such, for example, as an antenna to the resonant circuit 11.

The two resonant circuits or circuit structures 10 and 11 are electromagnetically and electrostatically coupled to each other. The electromagnetic coupling coefficient is determined primarily by the distance between the resonant circuit structures 10 and 11. This distance, of course, is determined by the distance between the first pair of conductors 15, 16 and the second pair 31, 32. The electrostatic coupling coefficient is determined primarily by the diameter of the tubes 12 and 26 and also by the separation between the tubes.

The electromagnetic coupling is stronger at the low frequency end of the tuning range, while the electrostatic coupling is stronger at the high frequency end of the tuning range. Consequently, the coefficient of coupling is substantially uniform throughout the entire tuning range. The tuning range may be as large as 3 to 1 and is adjustable by selecting the dielectric constant of the tubes 12, 26, the wall thickness of the tubes and the air gap between the coatings 13, 14 and its associated core 20, for example. The filter structure of the invention will operate over a portion of the frequency range from approximately 50 to approximately 1000 mc.

Referring now to Figure 4 there is illustrated a modified filter structure in accordance with the invention. The filter structure again comprises two resonant circuits 57, 58. Each of the resonant circuits 57, 58 may be identical with the resonant circuit 11 of the filter structure of Figures 1 and 2. The filter structure again comprises a metallic plate 17 having four leg portions 15, 16, 31, 32 which extend at right angles to the plate 17. Each circuit structure 57, 58 comprises a glass tube 12 and 26 respectively.

The tube 12 is provided with three metallic coatings 60, 61 and 62 and a core which may be identical with the tuning core 33 is disposed movable within the tube 12. Tube 26 also comprises three metallic coatings 63, 64 and 65 disposed on the outside thereof and spaced along the axis of the tube. The circuit structure 58 is also provided with a movable tuning core which may again be identical with the tuning core 33 shown in Figure 2.

The legs 15, 16 are connected respectively to coatings 61 and 62, while the legs 31, 32 are connected to the coatings 64, 65. Leads 66 and 67 are connected respectively to the coatings 60 and 63. The coupling of the two circuit structures 57 and 58 is again determined in the manner previously outlined.

The equivalent circuit of the filter structure of Figure 4 is illustrated in Figure 5. Each of the resonant circuits 57 and 58 shown in Figure 5 is identical with the resonant circuit 11 of Figure 3. The resonant circuit 57 includes a fixed capacitor 68 and two variable capacitors 70 and 71. Furthermore, the resonant circuit 57 includes two fixed inductors 72 and 73. Similarly, the second resonant circuit 58 includes a fixed capacitor 74 and two variable capacitors 75 and 76. Furthermore, the resonant circuit 58 includes two fixed inductors 77 and 78.

The fixed capacitor 68 represents the capacitance between coating 60 and the tuning core; this capacitance does not vary upon movement of the tuning core. The variable capacitors 70 and 71 represent the capacitance between the coatings 61 and 62 respectively and the tuning core. The inductors 72 and 73 represent the inductance of the legs 15 and 16 respectively. In a similar manner the capacitors and inductors of the resonant circuit 58 in the equivalent circuit of Figure 5 may be identified with corresponding elements of the filter structure of Figure 4.

The two series resonant shunt circuits 70, 72 and 75, 77 may be tuned to two different frequencies outside of the pass band of the filter network. These series resonant circuits 70, 72 and 75, 77 will provide a high attenuation. The frequency of the pass band is determined by the entire filter network 57, 58. The fixed capacitors 68 and 74 again serve as coupling capacitors. The impedances of the series resonant circuits 70, 72 and 75, 77 at the frequency of the pass band serve to match respectively the impedance of an input circuit and of an output circuit to that of the filter network.

An input signal may, for example, be impressed between leads 66 and 51 and an output signal may be obtained from the leads 67 and 51. The corresponding input and output terminals are shown at 80 and 81 in Figure 5. Again the two tuning cores are preferably moved in unison so that the four variable capacitors 70, 71 and 75, 76 are varied in unison as indicated by dotted line 82. However, it is also feasible to provide fixed tuning cores so that the frequency of the pass band and of the adjacent attenuation regions is fixed.

The filter network of Figures 4 and 5 may, for example, be used to provide simultaneously rejection of image frequency signals and attenuation of the oscillator radiation. In that case, the series resonant circuit 70, 72 is tuned to the oscillator frequency to reduce oscillator radiation, while the series resonant circuit 75, 77 is tuned to the image frequency to provide a substantial attenuation of the undesired image frequency signals. The attenuation obtained by means of the circuit 70, 72 or 75, 77 amounts to approximately 30 db.

It has been found that the unloaded Q of the filter structure of the invention is approximately 250 which is reduced by the load represented by the input and output circuits to approximately 50.

The coatings 13, 14 and 27, 28, 30 as well as the coatings 60 to 65 may, for example, consist of copper or copper and silver. The end portion of the core 20 and the portions 35, 37 of core 33 are tapered to facilitate tracking of the filter structure of the invention with the local oscillator in a superheterodyne receiver and to provide for a substantially linear relationship between the movement of the cores and the resulting frequency of the pass band of the filter.

The inductance values of the conductors 15, 16 and 31, 32 essentially determine the frequency range over which the circuits are tuned. The conductors 15, 16, 31, 32 are of constant predetermined length. The minimum value of the capacitance of each of the series resonant circuits 10 and 11 may be made smaller than 1 micromicrofarad, which permits a large ratio of inductance to capacitance.

The plate 17, may, for example, consist of copper having a thickness of 50 mils. The legs 15, 16 may have a distance of 1¼ inches, while the legs 16, 31 may be spaced approximately 1⅜ inches between their midpoints. The distance between the lower edge of tube 12 and plate 17 may be approximately ⅞ inch. A filter structure with these dimensions may be tuned from 500 to 890 mc.

Figure 6 illustrates a portion of a superheterodyne receiver wherein a filter network of the type illustrated in Figures 1 and 2 is utilized to provide rejection of image frequency signals and furthermore to provide a pass band for the desired signals. Accordingly, the dotted box 85 is the equivalent circuit of the filter network which is similar to the equivalent circuit of Figure 3. However, in the receiver illustrated in Figure 6 the input and output terminals have been exchanged. The input signal, which may, for example, be obtained from an antenna is impressed on a transmission line such as a coaxial line 86 having its outer conductor grounded, while its inner conductor 87 is connected to an intermediate point of the inductor 43. The output signal is obtained between ground and the coupling capacitor 44.

The filter network 85 illustrated in Figure 6 operates in the same manner as that described in connection with Figures 1 to 3. However, in this case, the series resonant circuit 45, 47 of resonant circuit 11 is tuned to the frequency of the image frequency signals. These undesired signals are accordingly bypassed in the resonant circuit 11. If the image frequency currents were bypassed in the resonant circuit 10, which is now the input circuit, they might be radiated again and picked up by the resonant output circuit 11, and accordingly the image frequency signals could not be effectively rejected.

The filter network 85 is directly coupled to the mixer 88 which may, for example, be a crystal rectifier. Two inductors 90, 91 are connected between the input and output terminals of the mixer 88 and grounded to provide for a direct current return path. The oscillation generator has been schematically indicated at 92 and may have an output inductor 93 which is disposed adjacent to the output lead 94 of the mixer. Accordingly, the oscillatory energy is picked up by the lead 94 to beat with the received signal.

The thus developed intermediate frequency signal is impressed on a series resonant circuit including inductor 95 and a capacitor 96 (shown in dotted lines) representing the interelectrode capacitance between the grid and cathode of an intermediate frequency amplifier tube 97. Accordingly, maximum voltage is developed at the junction point between inductor 95 and capacitor 96, which is impressed on the control grid of the amplifier 97. The cathode of the amplifier 97 is grounded through a bias network 99.

The anode of the amplifier 97 is connected to a suitable anode voltage supply +B through inductor 100 across which the amplified output signal is developed. The output signal is obtained from output terminals 101, one of which is grounded while the other one is coupled to the anode of amplifier 97 through coupling capacitor 102.

Inductor 103 and capacitor 104 are connected in series between the grid and anode of the amplifier 97. The purpose of this network 103, 104 is to neutralize the interelectrode capacitance indicated at 105 between the anode and grid of the amplifier 97.

There have thus been disclosed U. H. F. filter structures which provide a pass band and one or two adjacent frequency regions having high attenuation. The entire filter network may be tuned through a portion of the U. H. F. range and the high attenuation regions will track with the frequency of the pass band throughout the tuning range. The filter structures of the invention have a high Q and a constant pass band throughout the tuning range. They may be used, for example, between the antenna and the mixer of a superheterodyne receiver or converter to provide a pass band for signals from a desired station and at the same time to reject either image frequency signals or to reduce oscillator radiation or both. The filter network of the invention is well adapted for mass production and its cost is very low.

What is claimed is:

1. A filter structure for U. H. F. signals comprising a first and a second resonant circuit structure, said first circuit structure including a first, a second and a third conductive capacitance member disposed in predetermined spaced relation, a first pair of conductors having inductance and connected individually to said first and second members, a first conductive element movably disposed with respect and adjacent to and insulated from said members to provide capacitance between each of said members and said first element; said second circuit structure including a fourth and a fifth conductive capacitance member disposed in predetermined spaced relation with respect to each other and to said first, second and third capacitance members, a second pair of conductors having inductance disposed to provide a predetermined amount of inductive coupling with said first pair of conductors and connected individually to said fourth and fifth members, a second conductive element movably disposed with respect and adjacent to and insulated from said fourth and fifth members to provide capacitance between each of said fourth and fifth members and said second element; means conductively connecting the free ends of said conductors, means including the third capacitance member and said connecting means providing one external circuit structure, and means providing a second external circuit connection with the second circuit structure.

2. A tunable filter structure for U. H. F. signals comprising a first and a second resonant circuit structure, said first circuit structure including a first, a second and a third conductive capacitance member spaced apart in a predetermined relation to each other, a first pair of conductors having inductance and connected individually to said first and second members, a first conductive tuning element disposed with respect and adjacent to and insulated from said members to provide capacitance between each of said members and said first tuning element, said first tuning element being movable with respect to said members and having at least one shaped portion associated with said first member to vary the capacitance between said shaped portion and said first member upon relative movement between said tuning element and members; said second circuit structure including a fourth and a fifth conductive capacitance member spaced apart in a predetermined relation with respect to each other and to said first, second and third capacitance members, a second pair of conductors having inductance disposed to provide a predetermined amount of inductive coupling with said first pair of conductors and connected individually to said fourth and fifth members, a second conductive tuning element disposed with respect and adjacent to and insulated from said fourth and fifth members to provide capacitance between each of said fourth and fifth members and said second tuning element, said second tuning element being movable with respect to said fourth and fifth members and having a shaped portion associated with said fourth member to vary the capacitance between said shaped portion and said fourth member upon relative movement between said second tuning element and its associated members; means conductively connecting the free ends of said conductors, means including the third capacitance member and said connecting means providing a first external circuit connection with said first circuit structure, and means providing a second external circuit connection with said second circuit structure.

3. A filter structure as defined in claim 2 wherein said first tuning element has two shaped portions associated with said first and said second members to vary the capacitances between both said first and second members and said first tuning element upon relative movement therebetween, while the capacitance between said third member and said first tuning element remains substantially constant.

4. A filter structure as defined in claim 2 wherein a U. H. F. input signal is impressed on said first external circuit connection and a U. H. F. output signal is derived from said second external circuit connection.

5. A filter structure as defined in claim 2 wherein a U. H. F. input signal is impressed on said second external circuit connection and a U. H. F. output signal is derived from said first external circuit connection.

6. In a superheterodyne receiver, a tunable filter structure for U. H. F. signals providing attenuation for a local oscillator wave and comprising a first and a second resonant circuit structure, said first circuit structure including a first tube of material having a high dielectric constant, a first, a second and a third metallic coating disposed in predetermined spaced relation to each other on the outside of said first tube, a conductor having inductance connected individually to said first and second coatings, a first metallic tuning core slideable in said first tube to provide capacitance between each of said coatings and said first core, said first core having two shaped portions associated with said first and second coatings to vary the capacitance between said shaped portions and the associated coatings upon movement of said core; said second circuit structure including a second tube of a material having a high dielectric constant, a fourth and a fifth metallic coating disposed in predetermined spaced relation with respect to each other and to said first, second and third metallic coating on the outside of said second tube, a conductor having inductance disposed to provide a predetermined amount of inductive coupling with said first named conductor connected individually to said fourth and fifth coatings, a second metallic tuning core slideable in said second tube to provide capacitance between each of said fourth and fifth coatings and said second core, said second tuning core having a shaped portion associated with said fourth coating to vary the capacitance between said shaped portion and said fourth coating upon movement of said second core; means conductively connecting the free ends of said conductors, a first pair of terminals connected between said connecting means and said third coating for impressing a U. H. F. input signal thereon, and a second pair of terminals coupled between said connecting means and one of the coatings of said second circuit structure for deriving a U. H. F. output signal therefrom, the series resonant circuit provided by said second coating and its associated conductor and said first core being tunable with the pass band provided by said filter structure throughout a predetermined tuning range to substantially reject said local oscillator wave and to pass desired U. H. F. signals with said pass band.

7. In a superheterodyne receiver, a tunable filter structure for U. H. F. signals providing attenuation for undesired image frequency signals and comprising a first and a second resonant circuit structure, said first circuit structure including a first tube of a material having a high dielectric constant, a first, a second and a third metallic coating disposed in predetermined spaced relation to each other on the outside of said first tube, a conductor having inductance connected individually to said first and second coatings, a first metallic tuning core slideable in said first tube to provide capacitance between each of said coatings and said first core, said first core having two shaped portions associated with said first and second coating to vary the capacitance between said shaped portions and the associated coatings upon movement of said core; said second circuit structure including a second tube of a material having a high dielectric constant, a fourth and a fifth metallic coating disposed in predetermined spaced relation with respect to each other and to said first, second and third metallic coating on the outside of said second tube, a conductor having inductance disposed to provide a predetermined amount of inductive coupling with said first named conductor connected individually to said fourth and fifth coatings, a second metallic tuning core slideable in said second tube to provide capacitance between each of said fourth and fifth coatings and said second core, said second tuning core having a shaped portion associated with said fourth coating to vary the capacitance between said shaped portion and said fourth coating upon movement of said second core; means conductively connecting the free ends of said conductors, a first pair of terminals coupled between said connecting means and one of the coatings of said second circuit structure for impressing a U. H. F. input signal thereon, and a second pair of terminals connected between said connecting means and said third coating for deriving a U. H. F. output signal therefrom, the series resonant circuit provided by said second coating and its associated conductor and said first core being tunable with the pass band provided by said filter structure throughout a predetermined tuning range to substantially reject said image frequency signals and to pass desired U. H. F. signals within said pass band.

8. A tunable filter structure for U. H. F. signals comprising a first and a second resonant circuit structure, said first circuit structure including a first tube of a material having a high dielectric constant, a first, a second and a third metallic coating disposed about said tube and spaced along the axis thereof, a first metallic tuning core slideable in said first tube to provide capacitance between each of said coatings and said first core, said first core having two tapered portions associated with said first and second coating to vary the capacitance between said shaped portions and the associated coatings upon movement of said core; said second circuit structure including a second tube of a material having a high dielectric constant, a fourth and a fifth metallic coating disposed about said second tube and spaced along the axis thereof, a second metallic tuning core slideable in said second tube to provide capacitance between its associated coatings and said second core, said second core having a shaped portion cooperating with said fourth coating to vary the capacitance between said fourth coating and said core upon movement thereof; a metallic plate having four legs extending substantially at right angles thereto, said legs being connected individually to the first and second coatings of said first circuit structure and to the fourth and fifth coating of said second circuit structure, each of said legs providing inductance, a first pair of terminals connected between said plate and said third coating, and a second pair of terminals connected between said plate and one of the legs of said second circuit structure.

9. A filter structure for U. H. F. signals comprising a first and a second resonant circuit structure, said first circuit structure including a first, a second and a third conductive capacitance member disposed in predetermined spaced relation, a first pair of conductors having inductance and connected individually to said first and second members, a first conductive element movably disposed with respect and adjacent to and insulated from said members to provide capacitance between each of said members and said first element; said second circuit structure including a fourth, a fifth and a sixth conductive capacitance member disposed in predetermined spaced relation with respect to each other and to said first, second and third capacitance members, a second pair of conductors having inductance disposed to provide a predetermined amount of inductive coupling with said first pair of conductors and connected individually to said fourth and fifth members, a second conductive element movably disposed with respect and adjacent to and insulated from said fourth, fifth and sixth members to provide capacitance between each of said fourth, fifth and sixth members, and said second element; means conductively connecting the free ends of said conductors, means including the third capacitance member and said connecting means providing one external circuit structure, and means providing a second external circuit connection with the second circuit structure.

10. A filter structure for U. H. F. signals comprising a first and a second resonant circuit structure, said first circuit structure including a first, a second and a third conductive capacitance member disposed in predetermined spaced relation, a first pair of conductors having inductance and connected individually to said first and second members, a first conductive element movably disposed with respect and adjacent to and insulated from said members to provide capacitance between each of said members and said first element; said second circuit structure including a fourth, a fifth and a sixth conductive capacitance member disposed in predetermined spaced relation with respect to each other and to said first, second and third capacitance members, a second pair of conductors having inductance disposed to provide a predetermined amount of inductive coupling with said first pair of conductors and connected individually to said fourth and fifth members, a second conductive element movably disposed with respect and adjacent to and insulated from said fourth, fifth and sixth members to provide capacitance between each of said fourth, fifth and sixth members and said second element; means conductively connecting the free ends of said conductors, means including the third capacitance member and said connecting means providing one external circuit structure, and means including said sixth capacitance member and said connecting means providing a second external circuit structure.

11. A tunable filter structure for U. H. F. signals comprising a first and a second resonant circuit structure of substantially identical construction, said first circuit structure including a first, a second and a third conductive capacitance member disposed in predetermined spaced relation, a first pair of conductors having inductance and connected individually to said first and second members, a first conductive element movably disposed with respect and adjacent to and insulated from said members, said tuning element having three portions each being associated with one of said members to provide a capacitance, two of said portions associated with said first and second members being shaped to vary the capacitance provided therebetween upon relative movement of said tuning element with respect to said members, said element being shaped to maintain the capacitance between said third member and said element substantially constant; said second circuit structure including a fourth, a fifth and a sixth conductive capacitance member disposed in predetermined spaced relation with respect to each other and to said first, second and third capacitance members, a second pair of conductors having inductance disposed to provide a predetermined amount of inductive coupling with said first pair of conductors and connected individually to said fourth and fifth members, a second conductive element movably disposed with respect and adjacent to and insulated from said fourth, fifth and sixth members, said second conductive element having three portions each being associated with one of said fourth, fifth and sixth members to provide capacitance, two of said portions associated with said first and second members being shaped to vary the capacitance provided therebetween upon relative movement of said tuning element with respect to said members, said element being shaped to maintain the capacitance between said third member and said element substantially constant; means conductively connecting the free ends of said conductors, means including the third capacitance member and said connecting means providing one external circuit structure and means including the sixth capacitance member and said connecting means providing a second external structure.

References Cited in the file of this patent

UNITED STATES PATENTS

| | | |
|---|---|---|
| 1,603,805 | Riegger | Oct. 19, 1926 |
| 2,014,422 | Carter | Sept. 17, 1935 |
| 2,052,703 | Farnham | Sept. 1, 1936 |
| 2,075,956 | Payne | Apr. 6, 1937 |
| 2,383,463 | Benin | Aug. 28, 1945 |
| 2,440,269 | Hargrove | Apr. 27, 1948 |
| 2,514,337 | Reid | July 4, 1950 |
| 2,589,092 | Kihn et al. | Mar. 11, 1952 |

FOREIGN PATENTS

| | | |
|---|---|---|
| 542,364 | Germany | Jan. 23, 1932 |
| 454,845 | Great Britain | Oct. 5, 1936 |
| 541,712 | Great Britain | Dec. 8, 1941 |